United States Patent
Hwang et al.

(10) Patent No.: US 6,986,200 B2
(45) Date of Patent: Jan. 17, 2006

(54) METHOD FOR MOUNTING PARTS

(75) Inventors: Young-soo Hwang, Changwon (KR); Tae-yeon Cho, Changwon (KR); Jhin-woo Shin, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 181 days.

(21) Appl. No.: 10/305,232

(22) Filed: Nov. 27, 2002

(65) Prior Publication Data

US 2003/0070289 A1   Apr. 17, 2003

Related U.S. Application Data

(62) Division of application No. 09/617,125, filed on Jul. 14, 2000, now Pat. No. 6,634,091.

(30) Foreign Application Priority Data

Feb. 15, 2000  (KR)  ..................................... 00-7114
Jun. 12, 2000  (KR)  .................................. 00-32099

(51) Int. Cl.
*H05K 3/30*  (2006.01)
(52) U.S. Cl. ........................... 29/833; 29/832; 29/834; 29/712; 29/743; 414/737
(58) Field of Classification Search ................. 29/593, 29/740, 743, 832–834, 407.04, 705, 707, 29/709–712, 720; 414/737, 752.1; 901/40, 901/47

See application file for complete search history.

(56) References Cited

U.S. PATENT DOCUMENTS

| | | | |
|---|---|---|---|
| 5,172,468 A | 12/1992 | Tanaka et al. | 29/721 |
| 5,233,745 A | 8/1993 | Morita | 29/705 |
| 5,694,219 A | 12/1997 | Kim | 29/720 |
| 5,907,900 A | 6/1999 | Okazaki et al. | 29/740 |
| 5,924,192 A | 7/1999 | Wuyts | 29/833 |
| 6,101,709 A * | 8/2000 | Shiota | 29/833 |
| 6,230,398 B1 | 5/2001 | Murata et al. | 29/832 |

* cited by examiner

*Primary Examiner*—Minh Trinh
*Assistant Examiner*—Donghai D. Nguyen
(74) *Attorney, Agent, or Firm*—Finnegan, Henderson, Farabow, Garrett & Dunner, L.L.P.

(57) ABSTRACT

A method for mounting parts may include recognizing a particular part feeder where a part to be mounted is contained among a plurality of part feeders, moving a head unit to a position for picking up a part on the part feeder, moving an image sensor installed to be capable of moving to a position close to the particular part feeder, picking up a part from the particular part feeder with a suction nozzle installed at the had unit, moving the head unit to a position above the image sensor, detecting an image of the part held by the suction nozzle, moving the suction nozzle to a printed circuit board from the image sensor, and aligning the part with the printed circuit board while determining and compensating for an error generated when the part is picked up, and mounting the aligned part on the printed circuit board.

1 Claim, 10 Drawing Sheets

PRIOR ART

METHOD FOR MOUNTING PARTS

This is a division of Application No. 09/617,125, filed Jul. 14, 2000, now U.S. Pat. No. 6,634,091 which is currently pending and is incorporated herein by reference.

BACKGROUND OF THE INVENTION

1. Field of the Invention

The present invention relates to a part mounter and a method for mounting parts, and more particularly, to a part mounter and a method for mounting parts by which the required time and the distance equipment must move for mounting parts is minimized and the position of the parts is precisely recognized.

2. Description of the Related Art

In general, electronic parts such as semiconductor packages are mounted on a printed circuit board by using a part mounter. The part mounter picks up electronic parts supplied by a part supply portion such as a tray feeder or a tape feeder using vacuum suction and mounts the electronic parts at predetermined positions on the printed circuit board. Here, a head unit moves the electronic part to an image sensor to obtain information on the posture of the part held by a suction is nozzle. As the image sensor, a vision camera (a line CCD or an area CCD) is used. The image sensor detects state of the part held by the part suction portion so that information on the posture of the part is obtained. The part suction portion corrects the posture of the held part according to the image information and then mounts the part on the printed circuit board.

FIG. 1 is a perspective view showing the structure of a typical part mounter. Referring to the drawing, the part mounter includes a first Y-axis 12 and a second Y-axis 13, an X-axis 11 moving along the first and second Y-axes 12 and 13, and a head unit 14 installed to be capable of moving along the X-axis 11. A suction nozzle 15 is installed at the head unit 14 to be capable of rotating and moving up and down. A printed circuit board (PCB) 25 is transferred by a conveyer 19 to the position of a part 20 to be mounted. The head unit 14 moves between part feeders 18a, 18b, 18c, 18d and 18e, and the PCB 25. The suction nozzle 15 moves up and down and/or rotates to hold a part and mounts it on the PCB 25. At least one among the part feeders 18a, 18b, 18c, 18d and 18e may be a tape feeder or a tray. During a mounting process, the head unit 14 passes above an image sensor 16. The image sensor 16 is fixed at one side of the part mounter and detects the part held by the suction nozzle 15 so that it corrects a positional error generated when a part is held by the suction nozzle 15. The image sensor 16, for example, may have an image detecting device such as a vision camera (a line CCD or an area CCD).

FIG. 2 is a view schematically showing the path along which the head unit 14 shown in FIG. 1 moves. Referring to the drawing, the suction nozzle 15 of the head unit 14 picks up a part from the part feeders 18a, 18b, 18c, 18d and 18e and then moves to the position directly above the image sensor 16. The image sensor 16 senses the part held by the suction nozzle 15. Through a detecting process performed by the image sensor 16, an error generated when the part is held by the suction nozzle 15 can be recognized. Next, the head unit moves above a mounting position P on the PCB 25. The suction nozzle 15 of the head unit 14 descends and mounts the part at the mounting position P of the PCB 25. Here, to correct an error recognized through the sensing process, the head unit 14 changes its position in the coordinate system or the suction nozzle 15 rotates and then the part is mounted.

In the part mounter having the above structure, since the head unit 14 must travel from the part feeders 18a, 18b, 18c, 18d and 18e to the part mounting position P on the PCB 25 through the image sensor 16, the path of movement is long and complicated. That is, since the image sensor 16 is fixed at a particular position, the head unit 14 must move to the position directly above the image sensor 16 so as to sense the state of the held part.

FIG. 3 is a view showing an image of a state in which a part is held by the suction nozzle 15, which is taken by an image sensing apparatus. Referring to the drawing, the center of the suction nozzle 15 matches the central point A of an image 121. That is, when the suction nozzle 15 picks up a part 111 and moves just above the image sensor 16, the center of the suction nozzle 15 is designed to match the center of the image sensor 16. Thus, when a sensing process is performed by the image sensor 16, the center point A of the image 121 substantially matches the center of the suction nozzle 15. This is because a typical image recognition apparatus is fixed at one side of a part supply portion of a part mounter and the head unit 14 moves to a particular position after moving along a set path, that is, the center of the suction nozzle 15 matches the center of the image 121.

When the image sensing is performed after the suction nozzle 15 has picked up a part, the positional information of the central point O of a part is recognized with information on the size and shape of the part. Next, information on the tilt of the part is recognized by the information on the shape of the part. As shown in FIG. 3, recognizing the distance separated in the X direction and Y direction between the central point A of the image 121 and the central point O of the part 111, and a rotational degree θ is recognized and the separated distance and the rotational degree are compensated for.

However, to correct the error generated when the part is held, the image sensor 16 must be maintained in a fixed state. This is because the central point of the suction nozzle 14 must match the central point A of the monitor 121 to recognize the error when suctioning the part. Thus, if the central point of the suction nozzle 14 does not match the central point of the image 121 during the sensing process, performing correction an error is not possible. The positional information with respect to the nozzle is indirectly obtained and it is assumed that the above preconditions are met. Also, at least one of the image sensor 16 and the head unit 14 must be fixed.

SUMMARY OF THE INVENTION

To solve the above problems, it is an object of the present invention to provide a part mounter and a method for mounting parts so that part mounting work is performed quickly while correcting an error generated.

Accordingly, to achieve the above objects, there is provided a part mounter comprising a plurality of part feeders for storing and supplying a plurality of parts, a conveyer for transferring a printed circuit board, a head unit capable of moving and having a suction nozzle for picking up a part from the part feeders and mounting the part on the printed circuit board on the conveyer, and an image sensor installed to move along a path crossing a movement path of the head unit, for detecting an image of the part held by the suction nozzle.

It is preferred in the present invention that at least one reference portion, which is detected if not covered by the part when the image sensor detects an image of the part held by the suction nozzle, is provided at the head unit.

Also, it is preferred in the present invention that the image sensor moves close to the part feeder where a part is picked up.

Also, it is preferred in the present invention that the image sensor moves to a position where a path along which the head unit moves, between a position where a part is picked up from the part feeder and a position where the part is mounted on the printed circuit board, and a path along which the image sensor moves cross.

Also, it is preferred in the present invention that the image sensor is moved by a motor for providing a driving force, a ball screw rotated by the motor, and a bushing and a linear guide member installed at one side of the image sensor and coupled to the ball screw.

Also, it is preferred in the present invention that the image sensor is capable of moving by a linear motor.

Also, it is preferred in the present invention that the head unit is installed to be capable of moving along an X-axis which is installed to be capable of moving along a first Y-axis and a second Y-axis installed parallel to each other.

Also, it is preferred in the present invention that a pair of X-axes are installed to be capable of moving along a first Y-axis and a second Y-axis installed parallel to each other, and two head units are provided so that one can move along each of the X-axes, and two image sensors are provided close to both sides of the conveyer.

To achieve the above objects, there is provided a method for mounting parts which is achieved by recognizing a particular part feeder where a part to be mounted is contained among a plurality of part feeders, moving a head unit to a position for picking up a part on the part feeder, moving an image sensor installed to be capable of moving to a position close to the particular part feeder, picking up a part from the particular part feeder with a suction nozzle installed at the head unit, moving the head unit to a position above the image sensor, detecting an image of the part held by the suction nozzle, moving the suction nozzle to a printed circuit board from the image sensor, and aligning the part with the printed circuit board while determining and compensating for an error generated when the part is picked up, and mounting the aligned part on the printed circuit board.

It is preferred in the present invention that the method for mounting parts further comprises a step of recognizing whether the image sensor has moved to a position close to the particular part feeder after the image sensor was supposed to have moved to the position close to the particular part feeder.

Also, it is preferred in the present invention that the determining and compensating is performed by determining the coordinates of the center of the suction nozzle by detecting a position of a reference portion which is not covered by the part when the image is obtained, determining the coordinates of the center of the part from an image obtained by the image sensor, calculating a value of correction of the part position by determining an offset of the part from the displacement of the center of the part held by the suction nozzle from the center of the suction nozzle, and controlling a position for mounting the part with the suction nozzle according to the value of correction.

According to another aspect of the present invention, there is provided a method for mounting a part which is achieved by calculating an optimal movement path between a position for picking up a part from a part feeder and a position for mounting the part on a printed circuit board, moving a head unit to the position for picking up a part from a part feeder, calculating a position where a movement path of an image sensor crosses a path formed between the part feeder and the position for mounting the part along which the head unit moves, moving the image sensor to the crossing position, picking up a part with a suction nozzle of the head unit, moving the head unit to a position above the image sensor, detecting the part held by the suction nozzle by the image sensor, moving the head unit to the position for mounting the part on the printed circuit board, and aligning the part while determining and compensating for an error generated when the part is picked up, and mounting the aligned part.

It is preferred in the present invention that the method further comprises a step of recognizing whether the image sensor has moved to the cross position after the image sensor is moved to the cross position.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
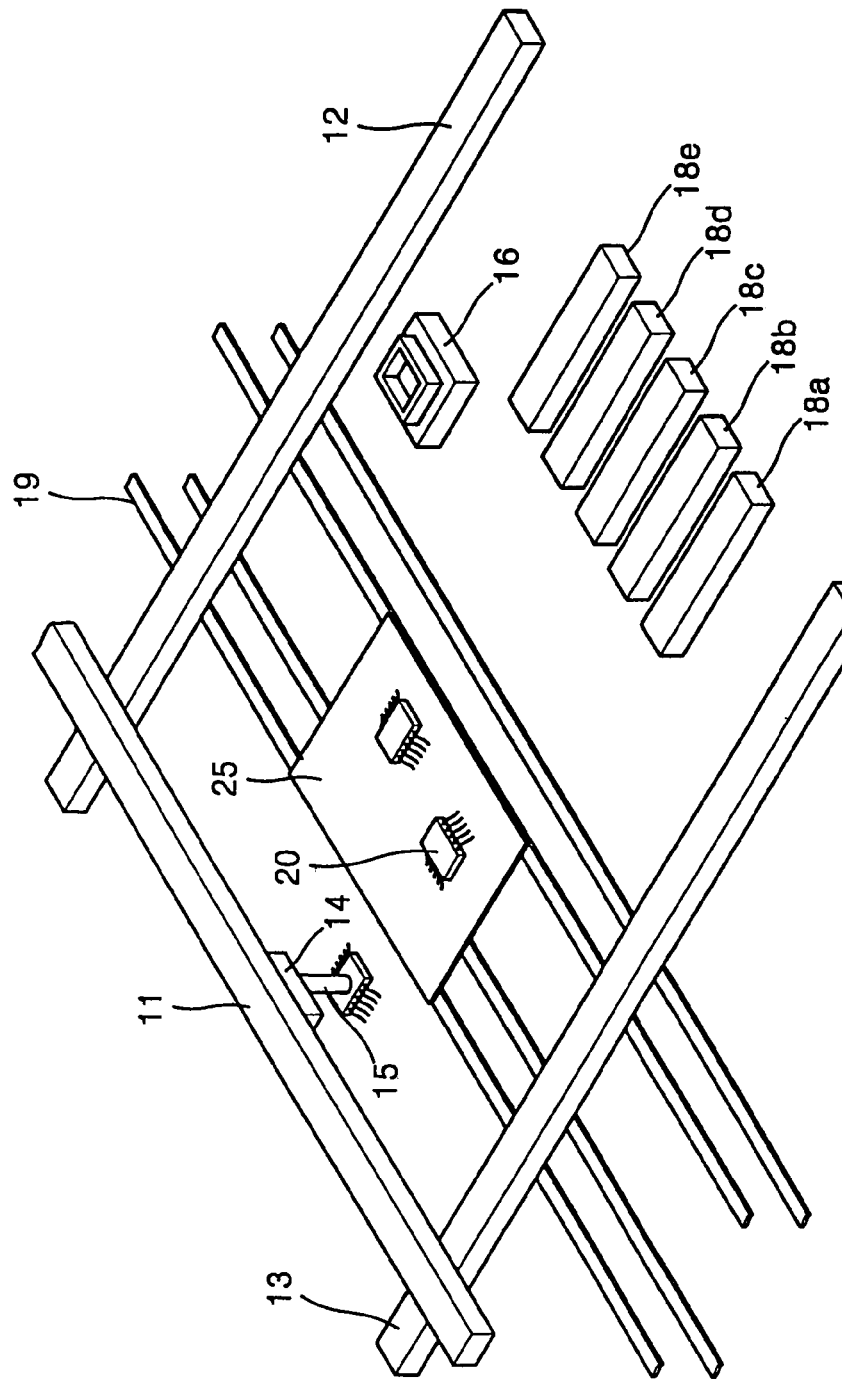
FIG. 1 is a perspective view showing the structure of the typical part mounter.
Figure 2:
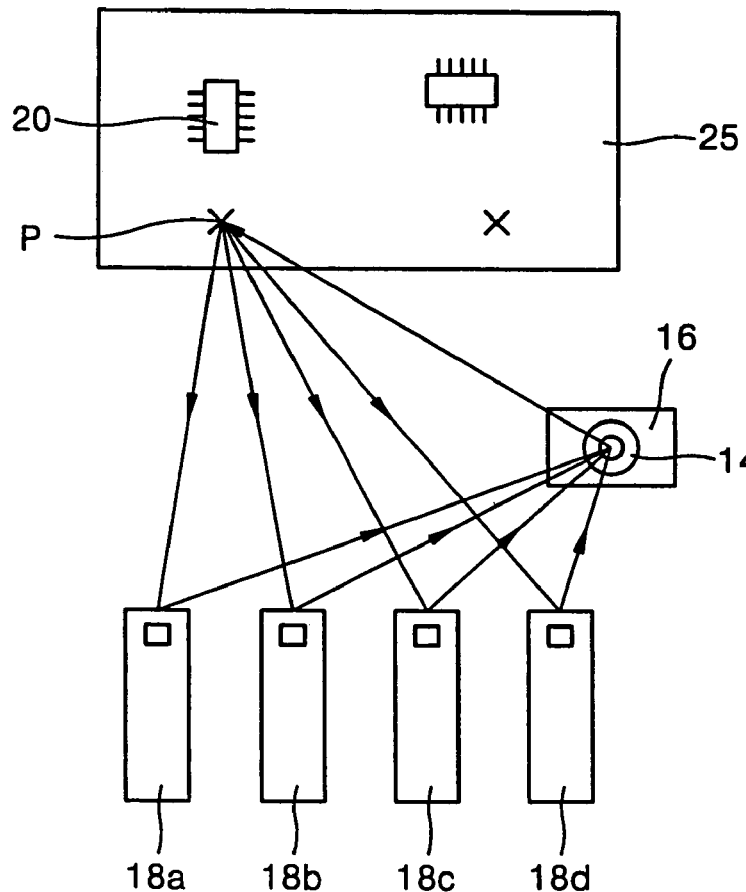
FIG. 2 is a view schematically showing the path along which the head unit of FIG. 1 moves.
Figure 3:
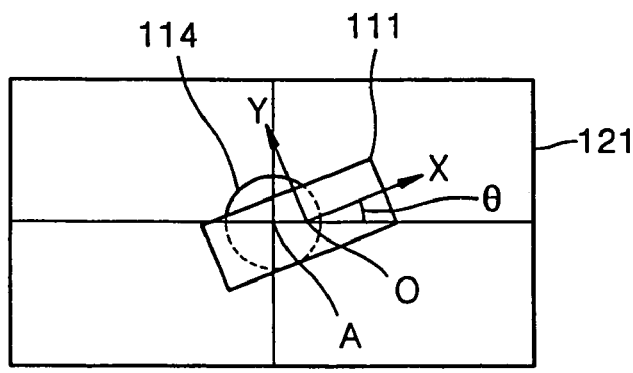
FIG. 3 is a view showing an image produced by an image sensing apparatus of a state in which a part is held by the suction nozzle.
Figure 4A:
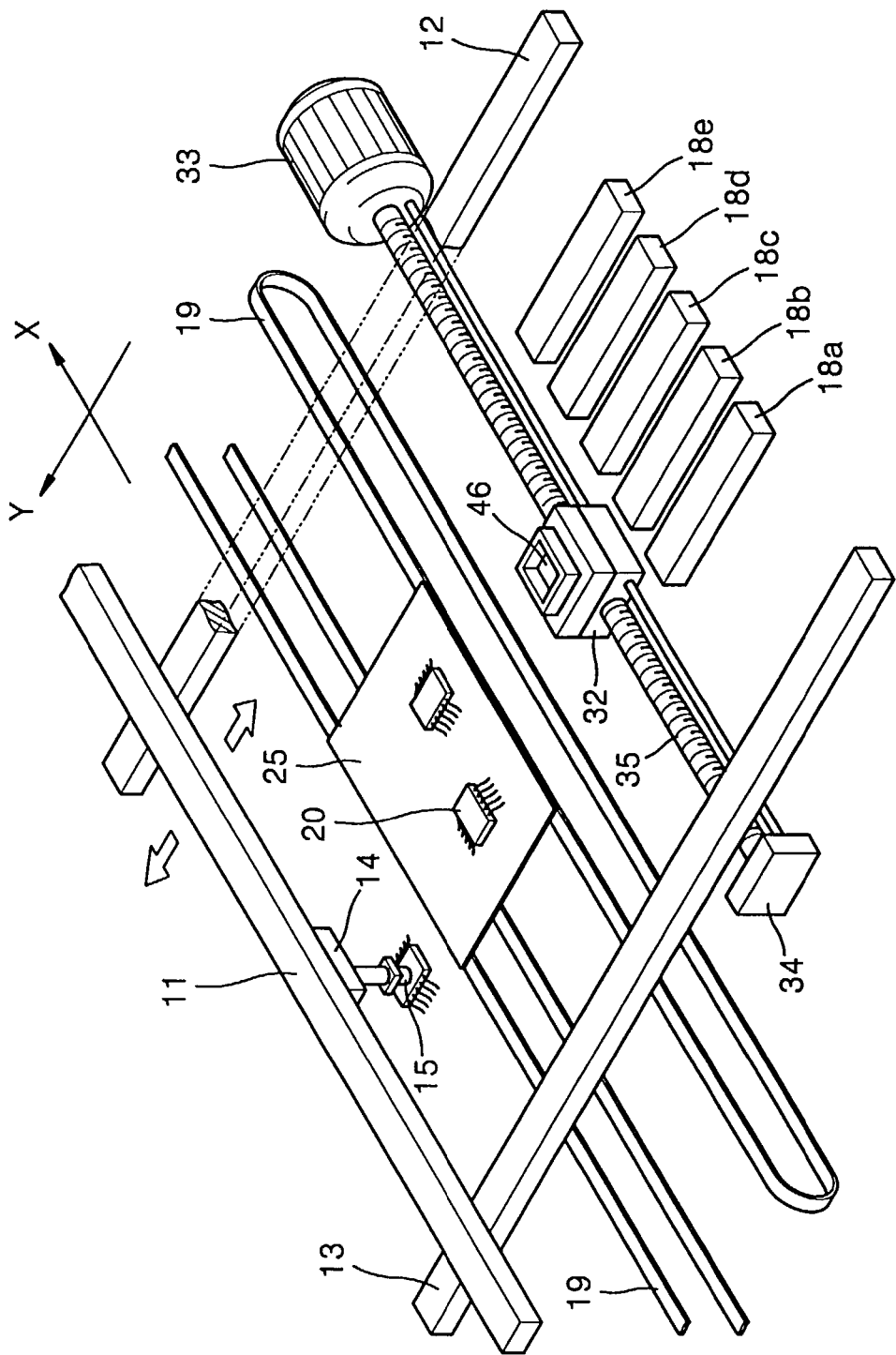
FIG. 4A is a perspective view showing the structure of a part mounter according to the present invention.

FIG. 4A shows the structure of a part mounter for performing a method for mounting parts according to the present invention. Here, the same reference numerals as these appearing in FIG. 1 denote the same elements having the same functions. Referring to FIG. 4A, a part mounter according to the present invention includes the first and second Y-axes 12 and 13 installed parallel to each other, the X-axis 11 installed to be capable of moving along the first and second Y-axes 12 and 13, the head unit 14 installed to be capable of moving along the X-axis 11, the suction nozzle 15 installed at the head unit 14 to be capable of rotating and moving up and down, and the conveyor 19 for transferring the printed circuit board (PCB) 25 to positions where parts are mounted. The head unit 14 moves between the part feeders 18a, 18b, 18c, 18d and 18e and the PCB 25. The suction nozzle 15 moves up and down and rotates to hold parts and mount the held parts on the PCB 25.

According to one characteristic feature of the present invention, the image sensor 46 for detecting a part held by the suction nozzle 15 of the head unit 14 is installed to be capable of moving. The image sensor 46 is installed to be capable of moving while being close to a particular part feeder for holding a part among the part feeders 18a, 18b, 18c, 18d and 18e of which one or more are provided. After the suction nozzle 15 is lowered to hold a part, the head unit 14 moves just above the image sensor 46, which is moved in advance near a particular part feeder from which the part is picked up, and performs sensing. Thereafter, the part is mounted on the printed circuit board 25.

According to another characteristic feature of the present invention, the movement path of the image sensor 46 for detecting the part held by the suction nozzle 15 of the head unit 14 may be set to cross linear paths along which the head unit 14 moves to part mounting positions from the respective part feeders 18a, 18b, 18c, 18d and 18e.

Furthermore, the head unit 14 moves along a substantially shortened path between the part mounting positions and the respective part feeders 18a, 18b, 18c, 18d and 18e, and the image sensor 46 moves to the position where the movement path of the image sensor 46 and the movement path of the head unit 14 meet, so that the part held by the suction nozzle 15 can be detected.

In FIG. 4A, a servo motor 33 and a ball screw 35 are applied to move the image sensor 46. When the servo motor 33 rotates, the ball screw 35 which is rotatably supported by a bearing 34 rotates. Since the ball screw 35 is coupled to a bushing 32 installed at the image sensor 46, the image sensor 46 can move close to any of the part feeders 18a, 18b, 18c, 18d and 18e. As a controller (not shown) controls driving of the servo motor 33, while the suction nozzle 15 of the head unit 14 picks up a part from one of the part feeders 18a, 18b, 18c, 18d and 18e, or before holding a part, the image sensor 46 moves in advance to the meeting position close to the corresponding part feeder and waits there. In another example, a linear motor is used instead of the ball screw 35.

Figure 4B:
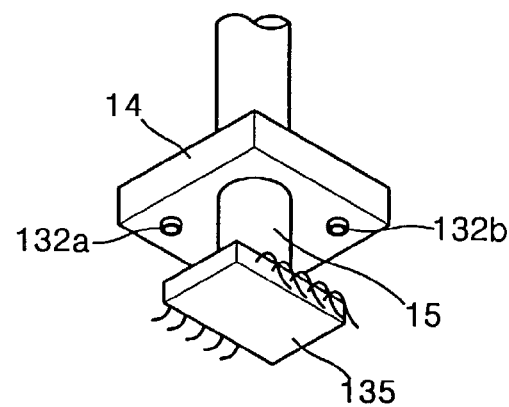
FIG. 4B is a perspective view showing part of the part mounter shown in FIG. 4A.

FIG. 4B is a perspective view showing part of the head unit 14 provided at the apparatus of FIG. 4A. Referring to the drawing, at least one of reference portions 132a and 132b is installed at one side of the head unit 14. The reference portions 132a and 132b are installed such that, when the image sensor 46 senses a part 135 held by the suction nozzle 15, at least one reference portion can be viewed, that is, the reference portions 132a and 132b are not covered by the part 135.

Providing the reference portions 132a and 132b is important in that the moving image sensor 46 (see FIG. 4A) recognizes an error generated during picking up a part. Since the position of the reference portions 132a and 132b and the center of the nozzle 15 are values which are known, when the image sensor 46 senses at least one of the reference portions 132a and 132b, the position of the center of the suction nozzle 15 can be determined from the position of the reference portions 132a and the 132b and the relative positions of the center of the suction nozzle 15 and the center of the part can be obtained. Thus, an error during picking up a part can be recognized from these values. A method of recognizing an error during picking up a part will be described later.

Figure 5:
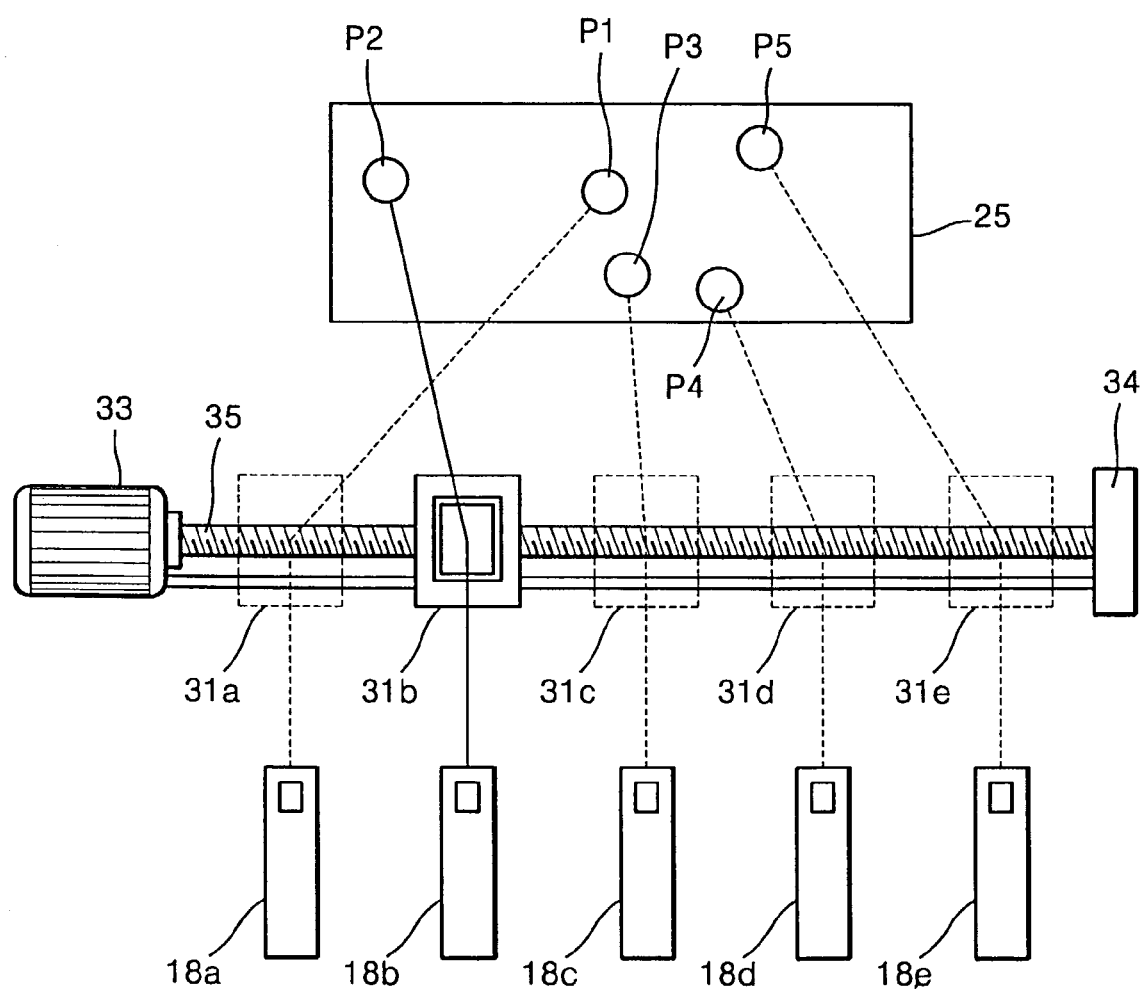
FIG. 5 is a view schematically showing a method for mounting parts according to a first preferred embodiment of the present invention.

FIG. 5 is a view schematically showing a method for mounting parts according to a first preferred embodiment of the present invention. The same reference numerals as those in FIG. 4A denote the same elements having the same functions. Referring to the drawing, a part feeder is a tray feeder, a stick feeder or a general feeder in which parts are wound around a reel. Five part feeders 18a, 18b, 18c, 18d and 18e are provided like the preferred embodiment shown in the drawing. Also, the image sensor 46 (see FIG. 4A) can move to a position close to each of the part feeders 18a, 18b, 18c, 18d and 18e, as shown in the drawing, and the positions of the image sensor 46 at that time are indicated by reference numerals 31a, 31b, 31c, 31d and 31e. When the ball screw 35 is driven by the servo motor 33 to rotate, the image sensor 46 linearly reciprocates along a typical guide member (a linear motion guide in the example shown in the drawing).

If the suction nozzle 15 picks up a part from the part feeder 18b, for example, and mounts the part at a position indicated by P2 on the PCB 25, the image sensor 46 moves to the position indicated by reference numeral 31b so as to be positioned as close as it can get to the part feeder 18b. Thus, the movement path of the head unit 14 can be reduced to the shortest distance from the part feeder 18b to the position 31b of the image sensor 46. Also, the movement path of the head unit 14 from the position 31b of the image sensor 46 to the position P2 for mounting the part becomes the shortest distance. Likewise, when a part is picked up from the part feeder 18e and mounted on a position P5 on the PCB 25, the image sensor 46 moves to the position indicated by the reference numeral 31e. Next, the suction nozzle 15 of the head unit 14 holding the part moves to the position 31e of the image sensor 46 so that detecting the part is performed. Then, the head unit 14 moves to the position P5 for mounting the part along the shortest route. The above operation applies in the same manner to the other positions P1, P2 and P3 and the other part feeders 18a, 18c and 18d.

In an actual embodiment, a plurality of suction nozzles can be provided to a head unit. Accordingly, the head unit moves between a plurality of part feeders so that each suction nozzle can pick up a part, before the head unit moves to the position directly above an image sensor. In this case, the image sensor moves close to a part feeder where the last part is picked up. As each suction nozzle of the head unit passes above the image sensor, detecting is performed. Next, correcting positional errors of the parts is performed according to information obtained from the detecting of parts held by the respective suction nozzles of the head unit. Then the head unit moves above a PCB and the parts are mounted thereon.

Figure 6:
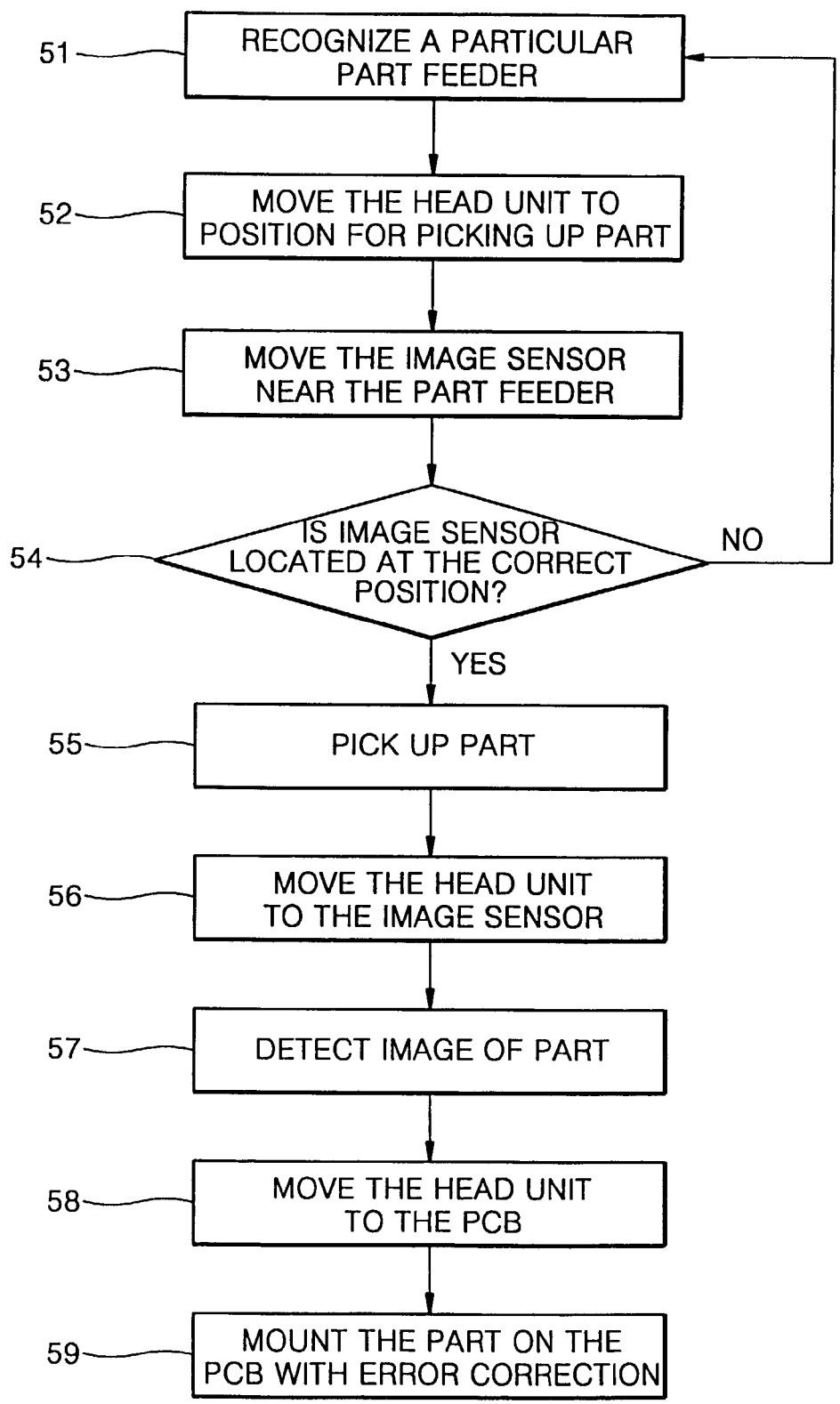
FIG. 6 is a flow chart for explaining the method for mounting parts according to the first preferred embodiment of the present invention.

FIG. 6 is a flow chart for explaining the method for mounting parts which was described with reference to FIG. 5. Referring to FIG. 6, a particular part feeder containing a part to be mounted, among a plurality of part feeders, is recognized prior to each performance of mounting a part (step 51). Next, the head unit 14 is moved to the position for picking up the part from the part feeder (step 52). The image sensor 46 is moved to the position close to the part feeder (step 53). It is determined whether the image sensor 46 is at the correct position (step 54). If it is determined that the image sensor 46 is not at the position close to the part feeder, the step of recognizing a particular part feeder begins again. If it is determined that the image sensor 46 is at the position close to the part feeder, the suction nozzle 15 picks up a part from the particular part feeder (step 55). The part feeder holding the part moves just above the image sensor 46 (step 56). Detecting an image of the part is performed (step 57). A signal for the detected image of the part is used through data processing as data for determining and correcting to an error in picking up the part and for determining the position for mounting the part. The head unit 14 is moved to the PCB 25 from the image sensor 46 (step 58). While determination of the part suction error is performed, the position for mounting a part is determined and the part is mounted on the PCB 25 (step 59).

Figure 7:
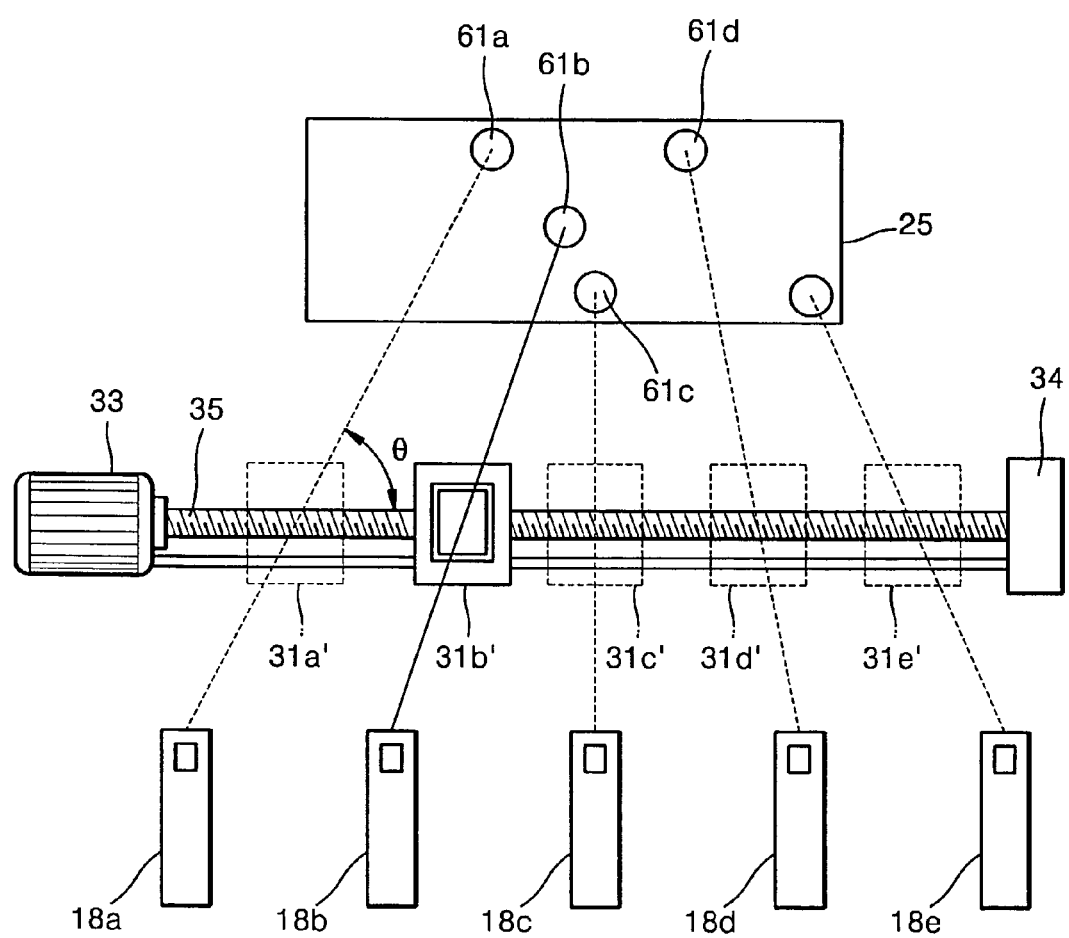
FIG. 7 is a view schematically showing a method for mounting parts according to a second preferred embodiment of the present invention.

FIG. 7 is a view showing a method for mounting parts according to a second preferred embodiment of the present invention. The reference numerals in the drawing which are the same as those in FIG. 4A denote the same elements having the same functions. Referring to the drawing, part feeders are indicated by reference numerals 18*a*, 18*b*, 18*c*, 18*d* and 18*e*. Also, an image sensor (not shown) can reciprocate along a typical guide member (not shown) when the ball screw 35 driven by the servo motor 33 rotates.

When a head unit (not shown) picks up a part from the part feeder 18*b* to mount the part at the position indicated by reference numeral 61*b* on the PCB 25, a linear route connecting a position for picking up a part on the part feeder 18*b* and a position 61*b* for mounting the part on the PCB 25 is chosen as the movement path of the head unit. Here, since the image sensor moves along the ball screw 35, the movement path of the image sensor matches the lengthwise direction of the ball screw 35. While the head unit moves to the position 61*b* for mounting a part on the PCB 25 from the part feeder 18*b*, the image sensor is positioned just above the head unit at the time when the head unit and the image sensor cross. Here, the position of the image sensor is indicated by reference numeral 31*b*' in FIG. 7.

Also, when parts are picked up from the other part feeders 18*a*, 18*c* and 18*d* to be mounted at other positions 61*a*, 61*c* and 61*d* on the PCB 25, the image sensor is moved to a position where a line connecting the relevant part feeder and mounting position and the movement path of the image sensor 31 cross. The positions are indicated by reference numerals 31*a*', 31*c*', 31*d*' and 31*e*'.

When the part held by the suction nozzle is sensed, a correction may need to be made considering an angle made by the image sensor 31 and the suction nozzle. Such a case occurs in a part mounter using a multi-joint robot, not in the gantry type part mounter shown in FIG. 4A. For example, when the head unit moves along a linear path to the part mounting position 61*a* on the PCB 25 from the part feeder 18*a*, and if the part is detected at the position 31', an angle θ is formed between a rectangular coordinate of the head unit and a rectangular coordinate of the image sensor. Thus, considering the above angle, calculation of the angle is needed in order to determine an error in picking up a part. The angle θ can be automatically calculated by constructing a data base with respect to the positions for mounting a part on the PCB, the position of the part feeder, and the current position of the image sensor on the movement path. Alternatively, as the suction nozzle holding a part passes above the image sensor, image information is received so that an angle can be calculated.

To compensate for the calculated angle θ, the suction nozzle 15 is rotated or the image sensor 46 is rotated. For example, as the suction nozzle 15 is rotated by the power from the servo motor (not shown), the angle θ is compensated for. In another example, the image sensor 46 is configured not only to reciprocate but also to rotate to compensate for the angle θ.

Figure 8:
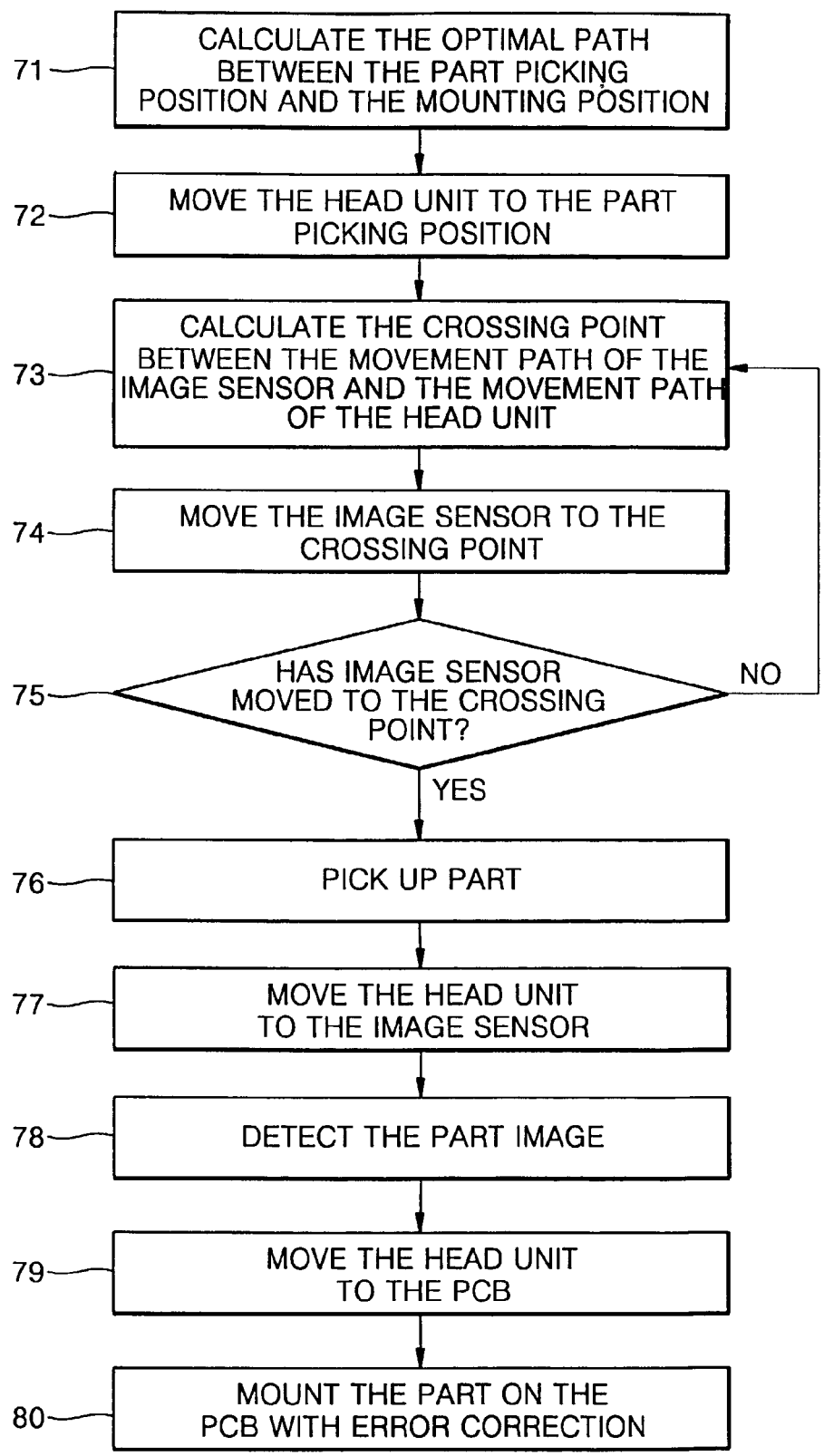
FIG. 8 is a flow chart for explaining the method for mounting parts according to the second preferred embodiment of the present invention.

FIG. 8 is a flow chart for explaining the method for mounting parts described with reference to FIG. 7. Referring to FIG. 8, an optimal movement path between a position for picking up a part from the part feeder and a position for mounting a part on the PCB is calculated by the controller of the part mounter (step 71). The head unit is moved to the position for picking up a part on the PCB (step 72). The crossing point of the movement path of the image sensor and the movement path of the head unit is calculated (step 73). The image sensor is moved to the crossing point (step 74). It is determined whether the image sensor is moved to the crossing point (step 75). Here, if the image sensor is not precisely moved to the crossing point, the crossing point is recalculated and the step of moving the image sensor to the crossing point is repeated.

If the image sensor is positioned at the crossing point, the suction nozzle of the head unit picks up a part (step 76) and the head unit is moved just above the image sensor (step 77). The image of the picked part is detected (step 78). The detected image of the part is processed in a predetermined method so as to be used as information for determination of the part mounting position after an error in picking up a part is determined. Then, the head unit is moved to the part mounting position on the PCB (step 79). The part is aligned and mounted at a predetermined position on the PCB with error correction (step 80).

In the case of a head unit having a plurality of suction nozzles, the image sensor is positioned at the point where the movement path of the image sensor and the shortest distance between the part picking position of the part feeder where the last part is picked up by one of the suction nozzles of the head unit and the part mounting position, cross. The head unit moves along the shortest linear path from the position where the last part is picked up to the part mounting position. While the head unit moves just above the image sensor positioned on the above movement path, information on position of the part is obtained by detecting the image of the part. Each suction nozzle of the head unit rotates the part according to the position information obtained by detecting while moving, and mounts the part on the PCB.

Figure 9:
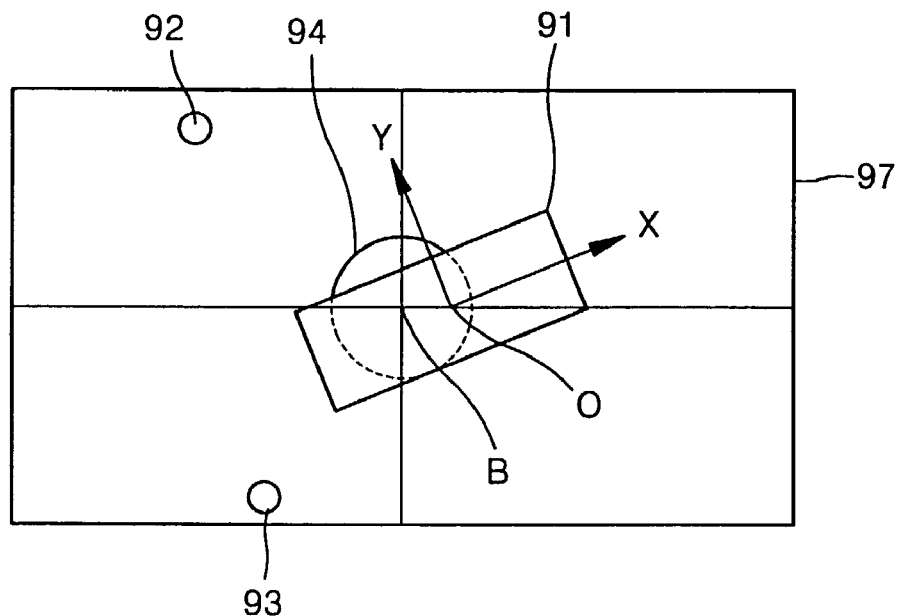
FIGS. 9 and 10 are views showing states in which an error in holding a part is recognized on a monitor of the part mounter according to the present invention.

FIG. 9 shows the image of a part detected by the image sensor. Referring to the drawing, when the center of a monitor 97 is B, the center B of the monitor 97 matches the center of a suction nozzle 94 holding a part 91. Elements indicated by reference numerals 92 and 93 on the monitor 97 are the reference portions 132*a* and 132*b* of FIG. 4B detected and displayed on the monitor 97. Since the center of the suction nozzle 94 of the part 91 can be determined by the reference portions 92 and 93, the displacement between the center of the suction nozzle 94 and the center O of the part 91 can be calculated.

That is, as shown in FIG. 4B, as at least one of the reference portions 132*a* and 132*b* which are installed at the head unit 14 where the suction nozzle 94 is installed is not covered by the part when the part is picked up, the displacement between the reference portions 132*a* and 132*b* and the centers of the suction nozzle 15 can be determined. Thus, the position of the center of the suction nozzle 13 is obtained from the image displayed on the monitor 97 by detecting the reference portions 132*a* and 132*b*, so that the displacement of the center O of the part can be easily obtained.

Figure 10:
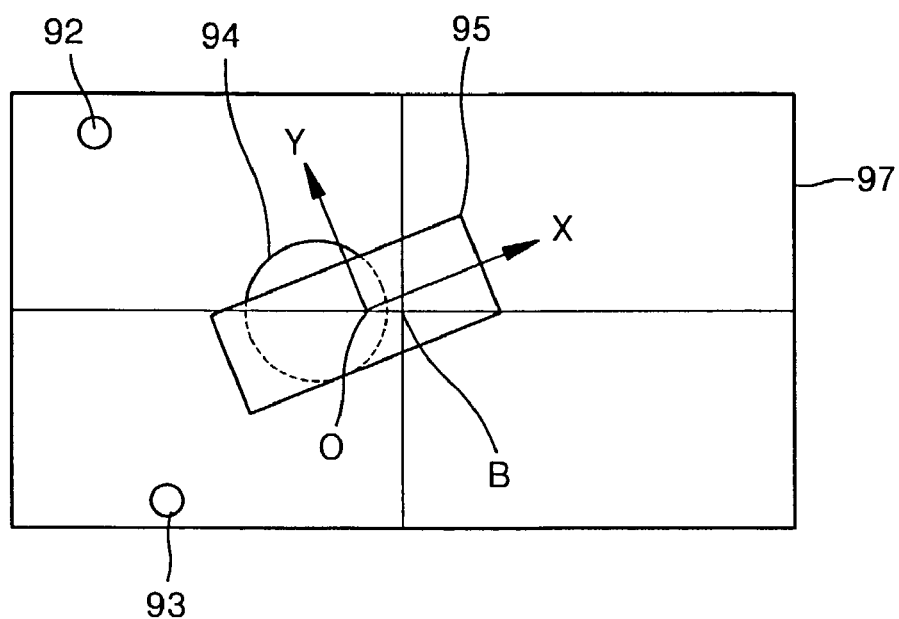

FIG. 10 shows another example of an image detected by the image sensor and displayed on the monitor. Referring to the drawing, when the center of the monitor 97 is B, the center B of the monitor 97 and the center of the suction nozzle 94 holding a part 95 do not match. Even when the center B of the monitor 97 and the center of the suction nozzle 94 do not match, a positional error of the part 95 can be measured. In this case, even if the fixed coordinates of the image sensor are not set, an accurate position for mounting a part can be obtained by calculating the coordinates of the center of the part 95 and the value of a relative position of the suction nozzle 94.

That is, the center of the suction nozzle 94 holding the part 95 being covered by the part 95 is not shown on the monitor 97. However, the position of the center of the suction nozzle 94 is obtained from the reference portions 92 and 93 displayed on the monitor 97 by detecting the reference portions 132a and 132b in FIG. 4B. The position of the center of the part is calculated from the detected image and the displacement between the two centers is obtained. The displacement can be treated in rectangular coordinates or in angular coordinates.

Figure 11:
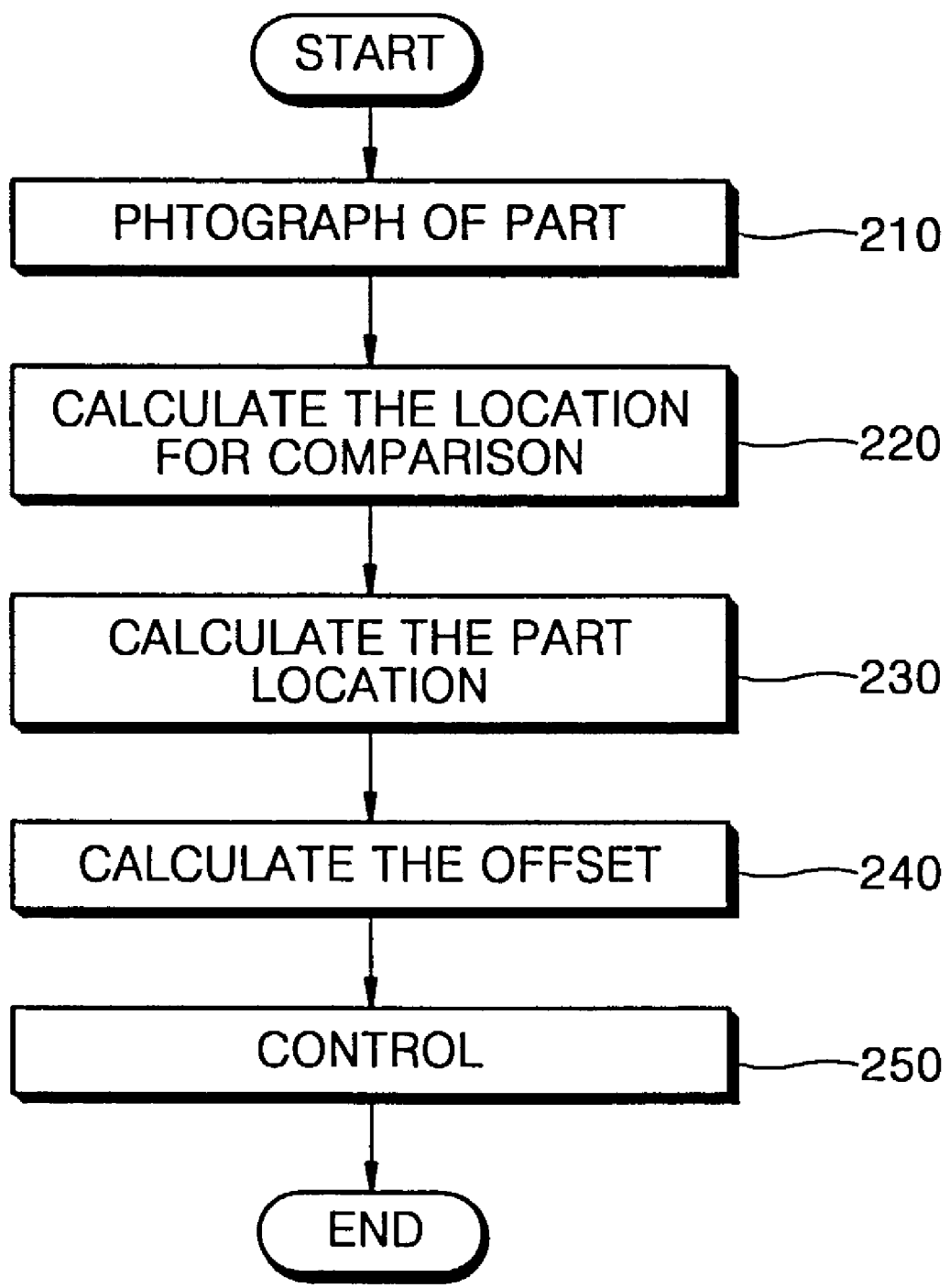
FIG. 11 is a flow chart for explaining a method of determining and correcting an error in holding a part according to the present invention.

FIG. 11 is a flow chart for explaining a method of determining an error generated while picking up a part, by the image sensor described with reference to FIGS. 9 and 10. Referring to FIG. 11, the part held by the suction nozzle 94 is moved, passing just above the image sensor, and the image of the part is detected (step 210). To detect the amount of deviation of the parts 91 and 95 from the center of the suction nozzle 94, the position of the center of the suction nozzle 94 is calculated by using the position of the reference portions 92 and 93 which are not covered by the parts 91 and 95, and a value of a relative position is obtained (step 220). The center of each of the parts 91 and 95 is obtained from the image of the part (step 230). An offset value of the part is obtained by comparing the value of the relative position and the value of the position of the center of the part, and a value of the error in the position of the part is obtained (step 240). Finally, as the controller is operated according to the error correction value, controlling the suction nozzle 94 to align the parts 91 and 95 is performed (step 250). Then, the parts are mounted.

Obtaining the relative position of the nozzle with at least one reference portion as above is possible because the head unit itself does not rotate in a gantry type part mounter and the relative position initially set between the reference portion of the head unit and the center of the suction nozzle is not changed. Thus, the value can be calculated with at least one reference portion. However, when the measurement is performed with two reference portions, even if a change occurs to a relative angle between axes for moving the head unit in X and Y directions in a gantry type part mounter, the center of the currently held part and the relative position of the suction nozzle can be calculated. Also, even when the head unit itself rotates, the value can be calculated.

Figure 12:
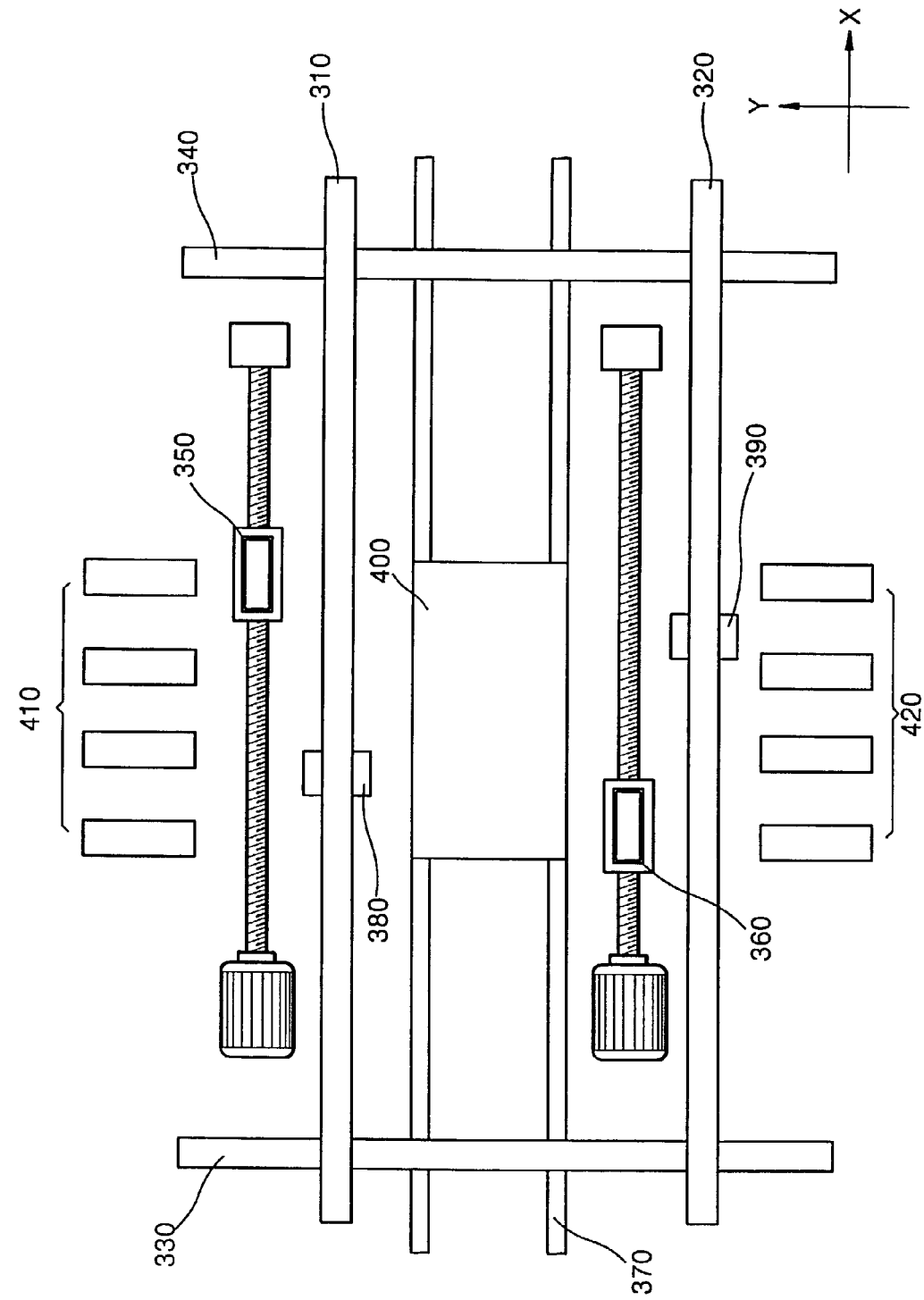
FIG. 12 is a plan view showing a part mounter of a double gantry type to which the present invention is applied.

FIG. 12 is a plan view showing a part mounter of a double gantry type to which the present invention is applied. Referring to the drawing, a first X-axis 310 and a second X-axis 320 are movably installed on a first Y-axis 330 and a second Y-axis 340. A first head unit 380 is installed on the first X-axis 310 to be capable of moving along the first X-axis 310. A second head unit 390 is installed on the second X-axis 320 to be capable of moving along the second X-axis 320. A PCB 400 is moved by a conveyor 370 and part feeders 410 and 420 for the respective head units are installed close to both sides of the conveyor 370.

In a double gantry type part mounter as shown in FIG. 12, two image sensors are installed. That is, as shown in the drawing, a first image sensor 350 and a second image sensor 360 are installed close to both sides of the conveyor 370. When each of the head units 380 and 390 picks up a part from the part feeders 410 and 420, each of the image sensors 350 and 360 moves close to each of the part feeders 410 and 420 to detect an image of the picked up part. Thus, the speed of mounting parts increases.

As described above, in the part mounter and the method for mounting parts according to the present invention, since the image sensor moves close to a particular part feeder or crosses the movement path of the part picking portion, the movement path of the part picking portion is shortened and thus the speed of mounting a part increases and the efficiency of mounting is improved. Also, an error generated during picking up a part can be easily determined and corrected with the moving image sensor.

It is noted that the present invention is not limited to the preferred embodiments described above, and it is apparent that variations and modifications by those skilled in the art can be effected within the spirit and scope of the present invention defined in the appended claims.

What is claimed is:

1. A method for mounting parts comprising the steps of:
   recognizing a particular part feeder where a part to be mounted is contained among a plurality of part feeders;
   moving a head unit to a position for picking up a part on the part feeder;
   moving an image sensor installed to be capable of moving to a position close to the particular part feeder;
   picking up a part from the particular part feeder with a suction nozzle installed at the head unit;
   moving the head unit to a position above the image sensor;
   detecting an image of the part held by the suction nozzle;
   moving the suction nozzle to a printed circuit board from the image sensor; and
   aligning the part with the printed circuit board while determining and compensating for an error generated when the part is picked up, and mounting the aligned part on the printed circuit board,
   wherein the determining and compensating is performed by the steps of:
   determining the coordinates of the center of the suction nozzle by detecting a position of a reference portion which is not covered by the part when the image is obtained;
   determining the coordinates of the center of the part from an image obtained by the image sensor;
   calculating a value of correction of the part position by determining an offset of the part from the displacement of the center of the part held by the suction nozzle from the center of the suction nozzle; and
   controlling a position for mounting the part with the suction nozzle according to the value of the correction.

* * * * *

UNITED STATES PATENT AND TRADEMARK OFFICE
CERTIFICATE OF CORRECTION

PATENT NO. : 6,986,200 B2  Page 1 of 1
APPLICATION NO. : 10/305232
DATED : January 17, 2006
INVENTOR(S) : Young-soo Hwang et al.

It is certified that error appears in the above-identified patent and that said Letters Patent is hereby corrected as shown below:

<u>Title page,</u>
Item [57], line 8, "had unit," should read --head unit,--.

Signed and Sealed this

Fourth Day of July, 2006

JON W. DUDAS
*Director of the United States Patent and Trademark Office*